United States Patent
Kobalka et al.

(10) Patent No.: US 6,990,416 B2
(45) Date of Patent: Jan. 24, 2006

(54) QUALIFICATION SIGNAL MEASUREMENT, TRIGGER, AND/OR DISPLAY SYSTEM

(75) Inventors: Jordan D. Kobalka, Colorado Springs, CO (US); Daniel P. Timm, Colorando Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 132 days.

(21) Appl. No.: 10/638,768

(22) Filed: Aug. 11, 2003

(65) Prior Publication Data

US 2005/0038615 A1    Feb. 17, 2005

(51) Int. Cl.
*G06F 3/14*    (2006.01)

(52) U.S. Cl. ............................. 702/67; 702/66; 702/69; 702/81

(58) Field of Classification Search .................. 702/66, 702/67, 69, 81, 117, 179, 182, 183; 324/73.1; 345/440; 716/10
See application file for complete search history.

(56) References Cited

U.S. PATENT DOCUMENTS

| | | | | |
|---|---|---|---|---|
| 4,791,356 A | * | 12/1988 | Warren et al. | 324/73.1 |
| 6,260,167 B1 | * | 7/2001 | Lo et al. | 714/744 |
| 6,834,380 B2 | * | 12/2004 | Khazei | 716/10 |

OTHER PUBLICATIONS

Martron, Yokogawa; "New Combination Analyser for CAN-bus Environments", Nov. 13, 2001.

* cited by examiner

*Primary Examiner*—Marc S. Hoff
*Assistant Examiner*—Felix Suarez

(57) ABSTRACT

A qualification signal display, trigger, and/or measurement (MTD) system is disclosed. An embodiment comprises receiving an event, wherein the event comprises a signal waveform, comparing the event with a qualification specification, wherein the qualification specification provides criteria for determining whether an event is a qualified event, and responsive to determining that the event is a qualified event, providing an indication to an MTD device of each qualified event.

31 Claims, 13 Drawing Sheets

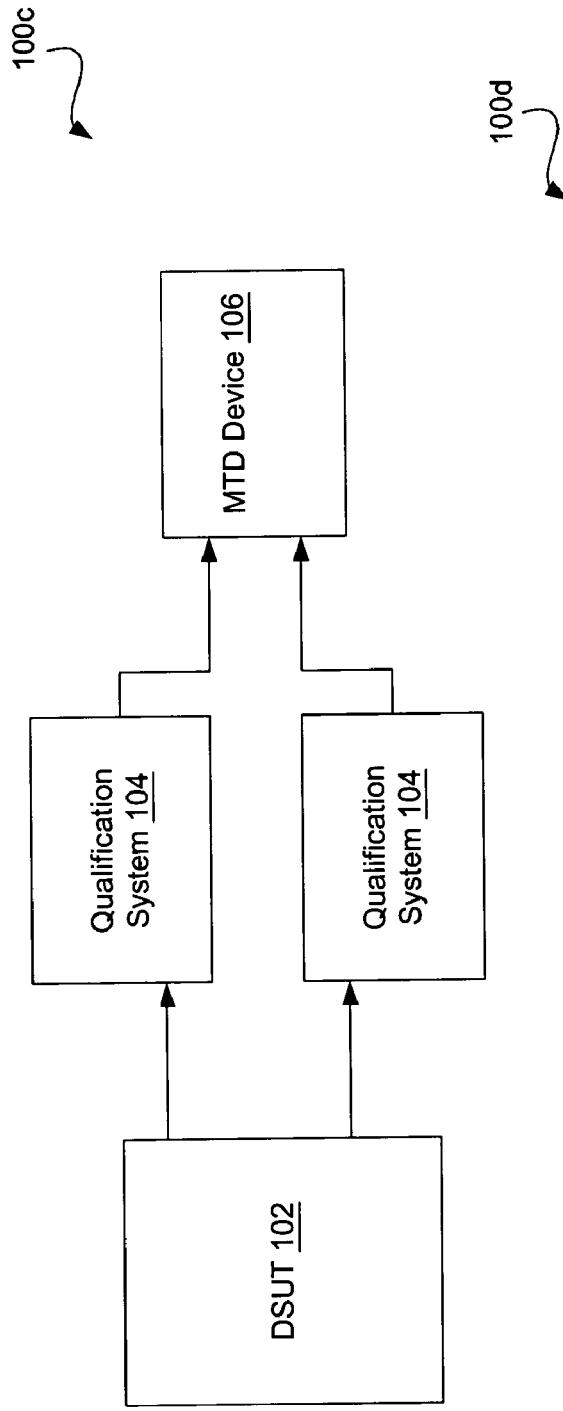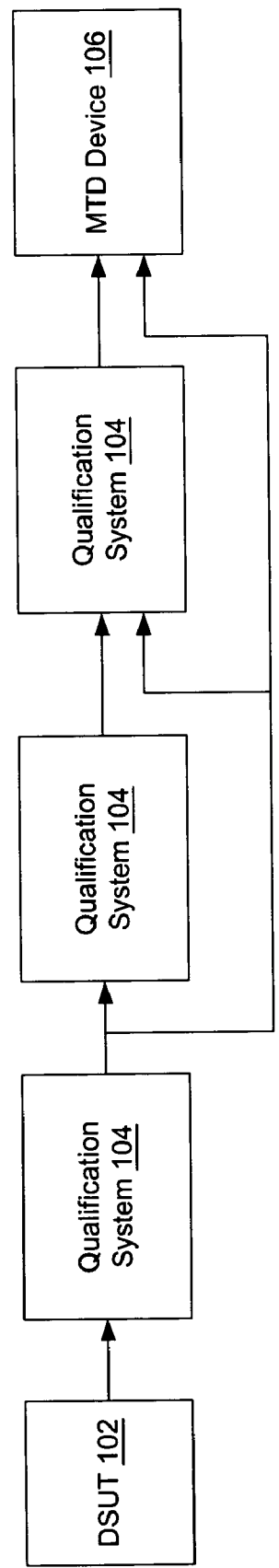
FIG. 1C
FIG. 1D

QUALIFICATION SIGNAL MEASUREMENT, TRIGGER, AND/OR DISPLAY SYSTEM

BACKGROUND

An oscilloscope is a type of measurement, trigger, and/or display device that can detect and display a signal (or representation of a detected signal) from a device or system under test (DSUT). In addition, an oscilloscope can use the detected signal or components of that signal, as a "trigger event" to generate another signal if the detected signal or components thereof meet trigger specifications that specify defined signal characteristics to prompt triggering, such as frequency, amplitude, and/or other characteristics. The generated signal is typically used to synchronize data acquisition for later display and/or measurement, and is optionally used as an input signal to another device. For example, modem oscilloscopes typically have an output connection labeled, "trigger out" or similar label. When the oscilloscope triggers, it provides a signal via the "trigger out" to another measurement, trigger, and/or display device to provide for display and/or measurement of the waveform corresponding to such a triggering event, yet rarely if at all does this signal represent all instances when DSUT signals meet the scope's trigger specification.

It is often desirable to measure the frequency of when the detected signal or components thereof that are of interest to a user occur and/or to cascade such a signal with other signals for further functionality, such as additional trigger filtering. However, performance of such functions often requires a cumbersome and expensive array of oscilloscopes, which often introduces signal propagation delay, excessive impedance loading, and/or difficulty in acquiring accurate measurements. Thus, a need exists in the industry to address the aforementioned and/or other deficiencies and/or inadequacies.

SUMMARY

Embodiments of a qualification signal measurement, trigger, and/or display (MTD) system are provided. An exemplar embodiment, among others, implements the following steps: receiving an event, wherein the event comprises a signal waveform, comparing the event with a qualification specification, wherein the qualification specification provides criteria for determining whether an event is a qualified event, and responsive to determining that the event is a qualified event, providing an indication to the MTD device of each qualified event.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects can be better understood with reference to the following drawings. The components in the drawings are not necessarily to scale. Moreover, in the drawings, like reference numerals designate corresponding parts throughout the several views.

FIGS. 1C and 1D are block diagrams that illustrate other configurations for the embodiments described in FIGS. 1 and 2.

DETAILED DESCRIPTION

The description that follows will describe embodiments of a qualification system in an example test system implementation. The qualification system provides advanced triggering functionality for a measurement, trigger, and/or display (MTD) device. In particular, the qualification system enables a single MTD device, such as an oscilloscope, to probe a device under test using one or more probes, trigger on all or substantially all qualified events in the device under test, accurately measure the frequency of the qualified events, and display the qualified event. The qualification system can be incorporated internally to the MTD device, or the qualification system can be coupled externally to the MTD device, for example, via a general-purpose input channel. Note that the functions of measurement, triggering, and/or display may be embodied in a single device, such as an oscilloscope, or distributed among several devices. Several features enabled by the qualification system are described in the context of a testing system that uses an oscilloscope, with the understanding that other MTD devices, for example, logic analyzers, can similarly benefit from the functionality of the qualification system.

Note that qualification, qualified, and like terms are generally used in association with functionality of the qualification system, and triggering, trigger, and the like are generally used in association with the functionality of the MTD device. As is described in further detail below, the qualification system seeks to "qualify" received signals or events, or rather, determine if the received event matches a qualification specification. If the received event matches the qualification specification, the event is referred to as a "qualified event." The MTD device compares the qualification signal (and possibly other signals) with its own internal trigger specification, and if there is a match, then triggering is performed (and thus the qualified event is considered a triggering event).

Figure 1A:
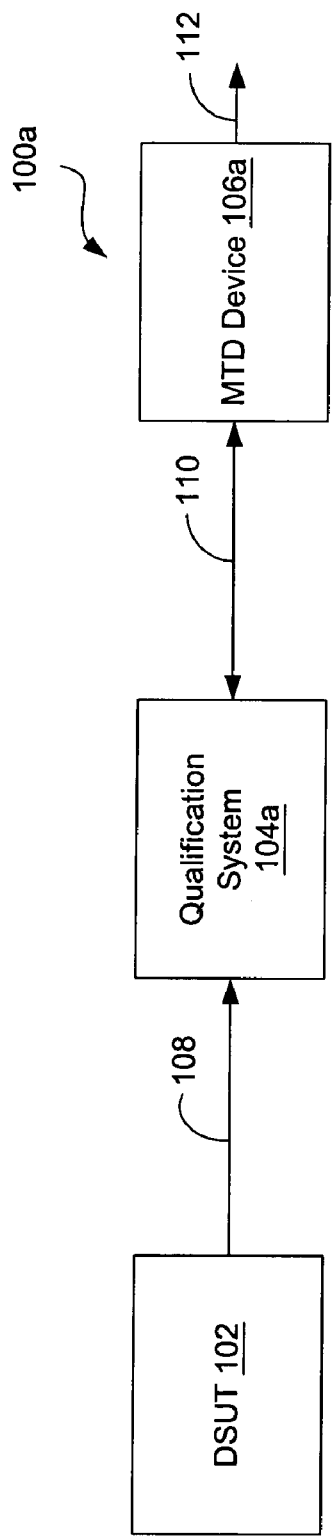
FIG. 1A is a block diagram that illustrates an embodiment for a qualification system.

FIG. 1A is a block diagram that illustrates an example test system that includes an embodiment of a qualification system. The test system 100a includes one or more of a device or system under test (DSUT) 102, a qualification system 104a, and a measurement, trigger, and/or display (MTD) device 106a. Note that lower case letters, such as "a"

or "b" are used throughout this disclosure to designate different embodiments and/or examples for like-systems or components. The qualification system 104a receives one or more signals (herein a DSUT signal) from the DSUT 102 over one or more connections represented by connection 108. In some embodiments, the connection 108 can be omitted, and communication between the DSUT 102 and the qualification system 104a can occur over a wireless medium. The DSUT signal can include a digital or analog waveform of defined characteristics that the qualification system 104a uses, at least in part, to determine if the DSUT signal includes a qualified event (e.g., an event, or signal characteristic, that a user deems of interest for measurement, triggering, and/or display purposes). The qualified event can include a plurality of signal pulses (e.g., representing a bit pattern) that occur at a defined periodicity, a difference in pulse width and/or amplitude, among other signal characteristics. The interface to the DSUT 102 can include one or more analog probes and/or digital connections that monitor a bus or other connections and/or components located in the DSUT 102.

The qualification system 104a includes signal conditioning functionality, such as amplification, demodulation, and/or digitizing functionality. The qualification system 104a may also include transceiver functionality for passing the DSUT signal, or a representation thereof, to the MTD device 106a over connection 110. Connection 110 can represent a physical medium, or wireless medium, that is coupled to a general-purpose input channel of the MTD device 106a. Connection 110 can include one or more signal paths, including a path to pass the "raw" DSUT signal, a path to provide a representation of the DSUT signal, a path representing that the qualification signal is met (the qualification signal), and/or a communication path to enable bi-directional communication between the MTD device 106a and the qualification system 104a. The bi-directional communication path provides for the transfer of such data as calibration factors, status of the qualification system 104a, identification strings, the qualification specification, etc.

The qualification system 104a receives, among other data, a system-defined and/or a user-defined qualification specification from the MTD device 106a. The qualification specification may include data such as bit patterns, protocols, and/or other signal features or characteristics. The qualification specification is used by the qualification system 104a to match an event included in the DSUT signal with events corresponding to user requirements as listed in the qualification specification. For example, using the qualification specification, the qualification system 104a determines what waveform characteristics in the DSUT signal qualify as a qualified event. Thus, a qualified event includes the signals received from the DSUT 102 over connection 108 that match the qualification specification forwarded by the MTD device 106a. If the DSUT signal includes a qualified event (e.g., matches the qualification specification), the qualification system 104a provides a qualification signal (e.g., a voltage pulse) to the MTD device 106a. By providing a qualification signal to the MTD device 106a, the qualification system 104a is indicating to the MTD device 106a when an event detected in the DSUT signal matches the qualification specification.

At the MTD device 106a, a user can measure relationships between qualified events occurring within the DSUT 102. The MTD device 106a can display the qualification signal and/or the DSUT signal (or representation thereof) to the user, and use the qualification signal as a trigger for data acquisition. By providing the user with a display of the qualification signal, the user can visually determine when the qualification specification was met. In addition, the user (via the MTD device 106a) can measure the elapsed time between these qualified events as well as make measurements on signals between the clearly defined qualified events.

In addition, the MTD device 106a can combine the qualification signal with other DSUT signals to provide more complex trigger specifications within the trigger system (not shown) of the MTD device 106a. Other DSUT signals may be combined at locations external and/or internal to the MTD device 106a. Multiple MTD devices can be cascaded, for example via connection 112.

Figure 1B:
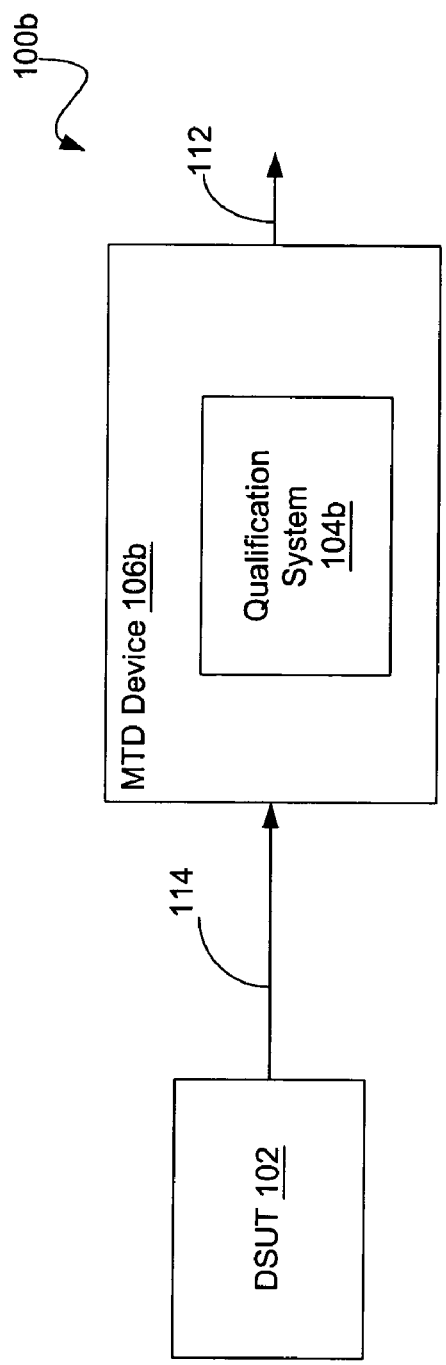
FIG. 1B is a block diagram that illustrates another embodiment for a qualification system that is located internally to a measurement, trigger, and/or display (MTD) device.

FIG. 1B is a block diagram that illustrates another test system that uses another qualification system embodiment, wherein the qualification system 104b is located internally to an MTD device 106b. In this example test system 100b, DSUT signals that include qualified and non-qualified events are detected at the DSUT 102, and received over connection 114 and acted upon by the qualification system 104b of the MTD device 106b. Signal conditioning and/or other functionality present in the qualification system 104a (FIG. 1A) can be included in or omitted from, in whole or in part, the qualification system 104b, and implemented by other circuitry within the MTD device 106b. The MTD device 106b can trigger on the qualification signal provided by the qualification system 104b, and/or combine the qualification signal with other DSUT signals to provide a more complex trigger specification, in well-known ways.

Figure 2:
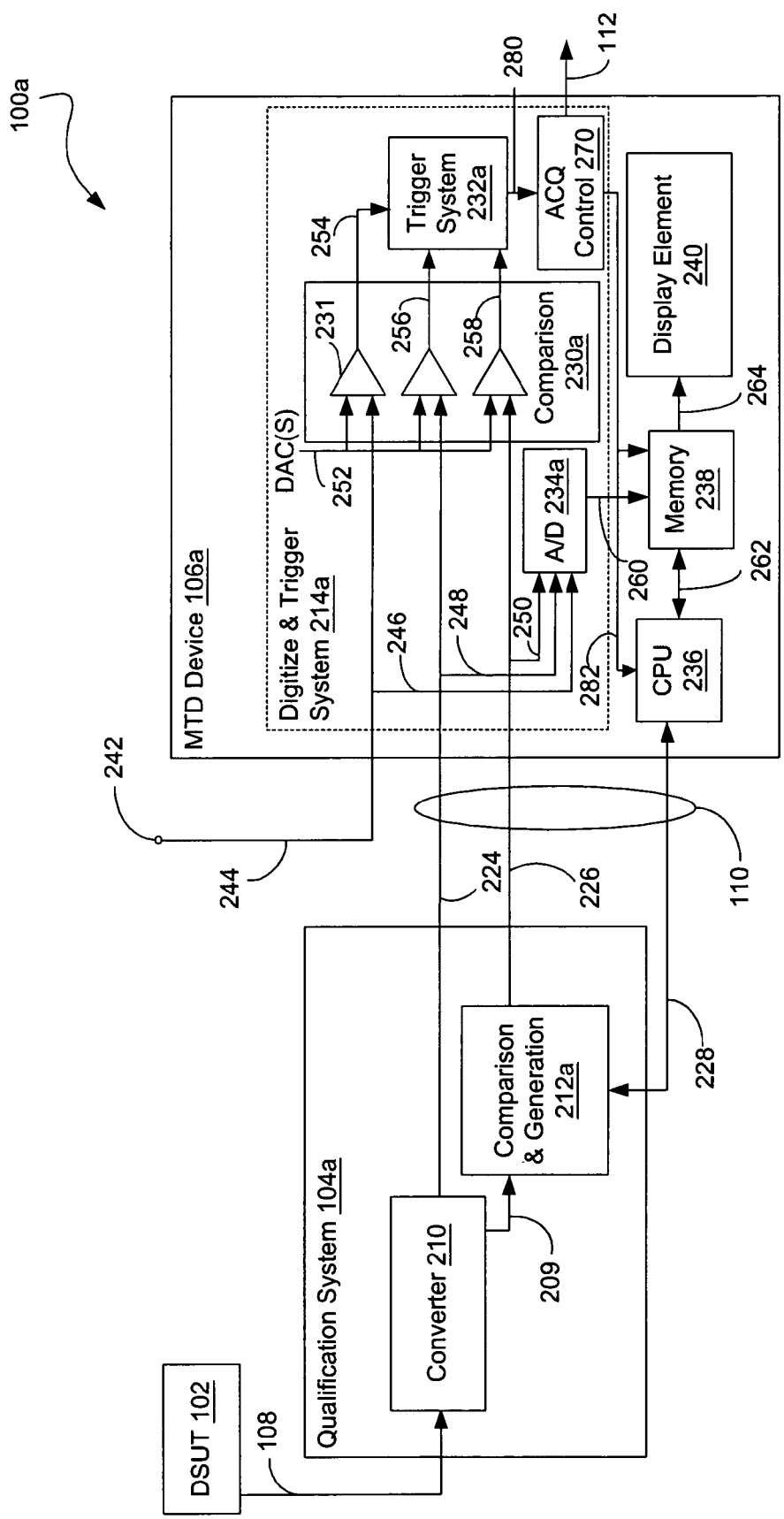
FIG. 2 is a block diagram that illustrates the qualification system embodiment in a test system as illustrated in FIG. 1A.

FIGS. 1C and 1D are block diagrams that illustrate other test system configurations for the embodiments described in FIGS. 1 and 2. FIG. 1C shows a test system 100c having a plurality of qualification systems 104 (corresponding to qualification system 104a or 104b) that are providing separate qualification signals to either an externally connected MTD device 106 (corresponding to MTD device 106a) or to an MTD device 106 having multiple qualification systems 104 integrated within the MTD device 106 (corresponding to MTD device 106b). FIG. 1D shows a test system 100d having cascaded qualification systems 104. In other words, qualification signals can be qualified based on a prior qualification signal in this arrangement. DSUT signals received by the MTD device 106 can be "raw" signals from the DSUT 102 (FIG. 1A or B), processed versions of the DSUT signal, and/or processed from other qualification systems 104 as shown. Further, qualification signals can be sent downstream to the MTD device or to another qualification system. Using the configurations of FIGS. 1C and 1D, a plurality of qualification signals can be used for matching with one or more qualification specifications.

FIG. 2 is a block diagram that illustrates the qualification system 104a and cooperating components for the test system 100a of FIG. 1A. The qualification system 104a includes a converter 210 and a comparison and generation module 212a. In general, the converter 210 functionally represents a transfer function that converts one or more DSUT signals received over connection 108 from the DSUT 102 into a format compatible with downstream components. For example, in the case of interrogating Controller Area Network (CAN) signals on one or more busses located in the DSUT 102, DSUT signals that range from 0 to 2 volts differential can be received over connection 108. These DSUT signals can be converted at converter 210 into one or more signals having a range between 0 to 5 volts (e.g., using complementary metal oxide semiconductor (CMOS) technology).

Additional functionality of the converter 210 can include analog-to-digital (A/D) functionality, amplification, demodulation, and/or transceiver functionality.

The converter 210 provides various signals over connection 110. Connection 110 includes connections 224, 226, and 228. Note that fewer or more connections can be included in connection 110, or different connections and/or media (e.g., wireless) can be used for the same or different types of signals, in other embodiments. Connection 224 provides a path for "raw" DSUT signals (e.g., which bypass conditioning components of the converter 210 or represent a digitized or otherwise signal-conditioned version of the DSUT signals) from the converter 210 to the MTD device 106a. The DSUT signals (or a conditioned version thereof) on connection 224 are used by the MTD device 106a to provide a display of the same to a user. In other words, the user is provided with a mechanism to observe what signal he or she is measuring and/or what signal the MTD device 106b is triggering on without the need for an additional MTD device, and without the need for additional probes to measure the DSUT signal in the DSUT 102.

Connection 226 carries the qualification signal that represents to the MTD device 106a that a DSUT signal includes an event that meets the qualification specification. Connection 228 includes a bi-directional communication path for the transfer of the qualification specification, among other data, from a central processing unit (CPU) 236 of the MTD device 106a to the comparison and generation module 212a. Connection 228 can be configured in a communication standard or protocol such as I²C, USB, RS232, proprietary, among others.

The converter 210 provides the DSUT signal (or conditioned version) over connection 209 to the comparison and generation module 212a. The comparison and generation module 212a can be implemented using a microcontroller. The comparison and generation module 212a stores the event, or a sampled version thereof, in memory (e.g., memory, internal registers, buffers, etc., not shown). Although sampling is performed by the comparison and generation module 212a on the event carried over connection 209, in other embodiments, the sampling can occur in a converter. For example, the converter 210 could be equipped with one or more A/D converters, which would sample the event and provide the sampled event to the comparison and generation module 212a. A comparison, or event matching routine, is performed in the comparison and generation module 212a between the values of the waveform stored in memory and values corresponding to the qualification specification. If the received waveform does not correspond to a qualified event (e.g., does not meet the qualification specification), memory is overwritten (e.g., via a write or erase-write operation) with the next received waveform for comparison. If the qualification specification is met by the received waveform, then the comparison and generation module 212a sends a qualification signal over connection 226 that is used by the MTD device 106a for triggering, measurement, and/or display. Alternatively, the comparison may be performed in real-time without the use of memory. For example, analog circuitry can be used in the qualification system 104a to perform well-known mask testing or provide a comparison of other analog parameters of a waveform.

As an example of the above-described operation, assume an application where the DSUT signal includes CAN packets as the event waveform. The comparison and generation module 212a compares the received CAN packets against the stored qualification specification provided from the CPU 236 of the MTD device 106a. If each pair of bits (or a defined quantity of bits, as in a digital implementation) match, then the qualification signal is asserted by the comparison and generation module 212a over connection 226.

The comparison and generation module 212a (and 212b, as described below) can be implemented in hardware, software, firmware, or a combination thereof. For hardware implementations, the comparison and generation module 212a, 212b can be implemented using a microcontroller and/or any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), a complex programmable logic device (CPLD), etc.

If implemented in software or firmware, as an alternative embodiment, the comparison and generation module 212a,b can be implemented in software or firmware that is stored in a memory and that is executed by a suitable instruction execution system.

The operating procedures of the comparison and generation module 212a,b which can comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory. In addition, the scope of the embodiments include embodying the comparison and generation in logic embodied in hardware or software-configured mediums.

Figure 3A:
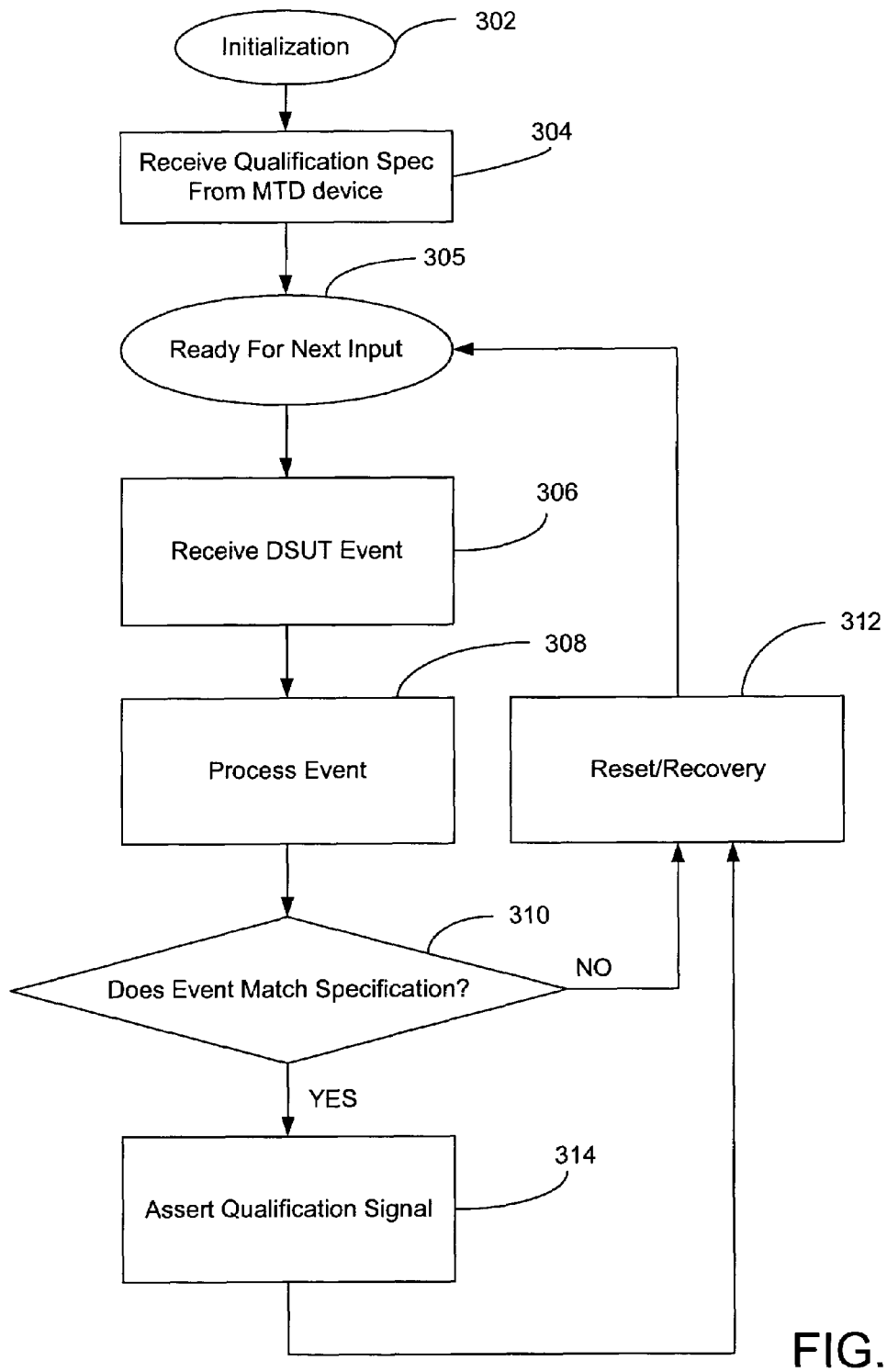
FIGS. 3A–3B are flow diagrams that illustrate the start-up and operating procedures of the qualification system illustrated in FIG. 2.
Figure 3B:
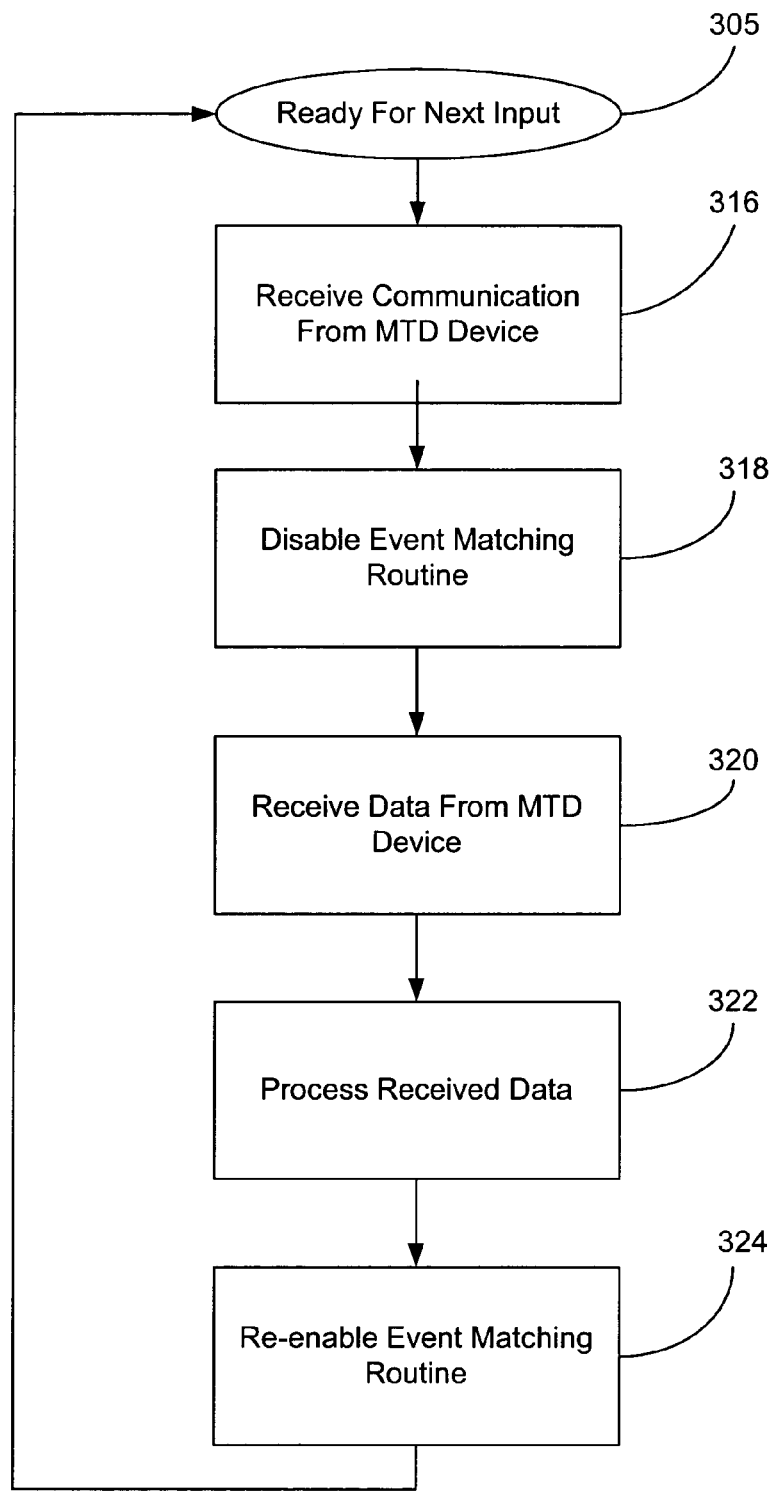

FIGS. 3A–3B are flow diagrams that illustrate the start-up and operating procedures of the qualification system 104a. A similar mechanism is implemented by the comparison and generation module 212b corresponding to the qualification system 104b (FIG. 1B). In particular, the flow diagrams of FIGS. 3A–3B illustrate the cooperation between the comparison and generation module 212a and the CPU 236 of the MTD device 106a to initialize the qualification system 104a and prepare the qualification system 104a for detecting and signaling qualified events. Any process descriptions or blocks in flow charts should be understood as representing modules, segments, or portions of code which include one or more executable instructions for implementing specific logical functions or steps in the process, and alternate implementations are included within the scope of the embodiments in which functions may be executed out of order from that shown or discussed, including substantially concurrently or in reverse order, depending on the functionality involved, as would be understood by those reasonably skilled in the art.

FIG. 3A includes a flow diagram that illustrates a procedure implemented by the comparison and generation module 212a for start-up and upon receiving a DSUT signal (or conditioned version thereof) from the DSUT 102. With continued reference to FIG. 2, step 302 includes an initialization step performed by the comparison and generation module 212a upon power being applied, for example via connection 110, when the qualification system 104a is connected to the MTD device 106a. The mechanisms of initialization to the MTD device 106a are similar to well-known initialization methodologies, and include a self-test of internal memory, communication to the MTD device 106a of the results of that self-test, audit of internal components and capabilities of the qualification system 104a, handshaking with the MTD device 106a to set-up communication, and the provision of information to the MTD device 106a (e.g., qualification system model number, serial number, state-machine type information, etc.).

Step 304 includes receiving and processing initial configuration information provided over connection 228 from the MTD device 106a. The CPU-236 transmits a qualification specification over connection 228 that the comparison and generation module 212a uses to detect and indicate a qualified event. The qualification specification can be based at least in part on user-input. The comparison and generation module 212a processes the qualification specification to set-up its internal hardware and/or software accordingly. In other embodiments, the qualification specification can be under direct user control, such as providing for knobs, buttons, or other user interfaces that are used to describe the waveforms of interest. Once the comparison and generation module 212a sets-up its internal hardware and/or software, it is ready to receive its next input (step 305).

The comparison and generation module 212a receives a DSUT event (step 306) over connection 209. As described above, the DSUT event can be included in a "raw" DSUT signal that bypasses the converter 210. The DSUT event can also pass through the converter 210 without signal conditioning, or can be included in a signal conditioned in the converter 210. Step 308 includes the comparison and generation module 212a processing the event. Such processing includes interrogating internal registers holding packet information, for example, after the event occurs. The information is processed as data streams arrive, or in other embodiments, cached into buffers (not shown) and processed after the event is completely received.

Step 310 includes comparing the DSUT event with the qualification specification that was sent by the CPU 236. In other words, the comparison and generation module 212a attempts to match the received waveform with the qualification specification. For example, in comparisons performed using received serial data streams, the event is compared to the qualification signal on a bit-by-bit basis. In addition, comparison can be performed on detectable characteristics of the waveform, such as edges, pulse widths, especially for non-serial events. Further, logic-analysis type comparisons can be performed and subsequently used for enabling triggering at the MTD device 106a. An example of the latter application can be where the qualification signal was in the form of a logic pattern, and the comparison and generation module 212a can compare the received event with the logic pattern and assert the qualification signal when a match is achieved. Alternatively, comparison operations can occur on a real-time basis, or can occur using one or more of a combination of all methodologies described herein.

If there is no match, the comparison and generation module 212a implements reset/recovery (step 312). Reset/recovery can be implemented according to different mechanisms. For example, in digital implementations, the interrupt (or polled status bits) is acknowledged, the received event is marked as processed, and the comparison and generation module 212a prepares for the next event. In analog implementations, the comparison and generation module 212a can reset on predetermined waveform characteristics, such as voltage levels, to prepare for the next incoming waveform. Upon reset/recovery being completed, the comparison and generation module 212a is ready for the next frame or event (step 305).

If there is a match, the comparison and generation module 212a sends a qualification signal over the connection 226 for use by the MTD device 106a (step 314). Reset/recovery can follow (step 312), and then the comparison and generation module 212a is ready for the next frame or event (step 305).

FIG. 3B is a flow diagram that provides an illustration of a procedure performed by the comparison and generation module 212a when the CPU 236 sends a post-initialization qualification specification. For example, the user may decide to modify the initially configured qualification specification. Assume initialization and receipt of a qualification signal have occurred (e.g., steps 302 and 304 of FIG. 3A).

From the ready state (or run state) at step 305, the comparison and generation module 212a receives, via well-known interrupt or polling mechanisms, a communication from the MTD device 106a (step 316). In step 318, the comparison and generation module 212a disables the current event matching routine that was implemented in response to the initial qualification specification.

Step 320 includes receiving data, including the post-initialization qualification specification, from the MTD device 106a. For example, the CPU 236 receives and stores the triggering requirements inputted by the user, and responsively sends a corresponding qualification specification to the comparison and generation module 212a over connection 228. The comparison and generation module 212a processes the received data in a manner as described above (step 322), and re-enables the event matching routine (step 324) with the new qualification specification. The comparison and generation module 212a is then ready for the next input (step 305).

Continuing with the description of FIG. 2, the MTD device 106a is a recipient of the signals provided by the qualification system 104a over connection 110. The MTD device 106a includes a digitize and trigger system 214a (including an acquisition controller 270), the CPU 236, memory 238, and display element 240. The trigger, digitize, and acquisition elements of the MTD device 106a interact similarly to well-known mechanisms used in current oscilloscopes to acquire and digitize data at a time desired by a user. Note that the configurations disclosed herein for the MTD device 106a and 106b are non-limiting examples used for illustration, with the understanding that other configurations of MTD devices can be used with the qualification system 104a and 104b. The digitize and trigger system 214a includes the acquisition controller 270, a comparison element 230a, a trigger system 232a, and an analog-to-digital (A/D) converter element 234a, the latter of which can include one or more A/D converters. The digitize and trigger system 214a of the MTD device 106a receives the qualification signal over the connection 226. Terminal 242 and connection 244 provide for additional inputs to the digitize and trigger system 214a including the "raw" or conditioned DSUT signal and additional inputs from other signal sources. The signals provided over connection 244 represent other DSUT signals of interest to the user that may or may not be processed by the qualification system 104a. These additional DSUT signals can be probed through analog, digital, and/or wireless mechanisms.

In general, once the qualification specification has been met, a qualification signal is sent to the MTD device 106a via connection 226. The qualification signal is treated by the MTD device 106a as a normal signal the MTD device 106a might acquire. In other words, the qualification signal appears as a general-purpose input (e.g., on a valid input channel), obviating the need for an extra input channel and enabling the full-operational power of the MTD device 106a for performing automated measurements, waveform analysis, etc.

The comparison element 230a includes one or more comparators 231 that receive a predetermined threshold voltage at one input via a digital-to-analog converter (DAC) (not shown) over connection 252. Signals on connection 110 and 244 are applied to another input of the comparators 231, and output pulses are provided over corresponding output connections 254, 256, and/or 258 to the trigger system 232a. The signals provided on output connections 254, 256, and/or 258 correspond to the waveforms included in signals carried over connections 110 and 244. Signals provided over connection 110 and 244 are also passed to an A/D converter element 234a via connections 246, 248, and 250.

The trigger system 232a provides triggering functionality for the MTD device 106a. The trigger system 232a can perform a trigger comparison step using the qualification signal. For example, the trigger system 232a uses the qualification signal (or a representation of the qualification signal) to determine when an event has occurred, and compares the qualification signal to its internal trigger specification to determine whether to trigger or not. If this comparison step is successful (e.g., a match exists between the trigger specification and the qualification signal), then acquisition may occur. Using well-known methods, the trigger system 232a provides a signal to the acquisition controller 270 via connection 280 indicating that a trigger has occurred, and the acquisition controller 270 responsively prompts a display of the acquired waveform from memory 238 to the display element 240. For example, acquisition can be as simple as edge triggering on the qualification signal. In other implementations, the qualification signal can be combined with other input DSUT signals (e.g., via connection 244) to perform more complex triggering, including pulse-width, pattern, and/or state triggering. The comprehensive triggering functionality of the trigger system 232a is retained when the MTD device 106a is receiving qualification signals from the qualification system 104a.

The trigger system 232a generates a time-mark corresponding to when the MTD device probed signals and/or the qualification signal meet the trigger specifications of the trigger system 232a. The trigger system 232a can generate this time-mark through implementing edge triggering on the qualification signal, or more sophisticated triggering methodologies such as triggering on pulses having a defined duration, pulse patterns existing across one or more channels, etc.

The trigger system 232a provides the time-mark to the acquisition controller 270 over connection 280. The acquisition controller 270 determines when an actual acquisition (e.g., waveform capture to memory) can occur. In one well-known implementation, the acquisition controller 270 makes an acquisition when a pre-buffer (not shown) is full (corresponding to an instance before the trigger event), a post buffer (not shown) is empty (corresponding to the previous trigger event), and unloading of the data from memory 238 to the display element 240 is complete. One responsibility for the acquisition controller 270 is to ensure that the correct period of digitized waveforms is stored in memory 238. This enables memory 238, under control of the CPU 236 via connection 262 and acquisition controller 270 (or other well-known control mechanisms), to capture qualified events in memory 238. Once captured in memory, the qualified events, among other digitized signals, can then be unloaded over connection 264 to the display element 240. The acquisition controller 270 can also provide an output trigger signal to another device over connection 112.

Figure 4:
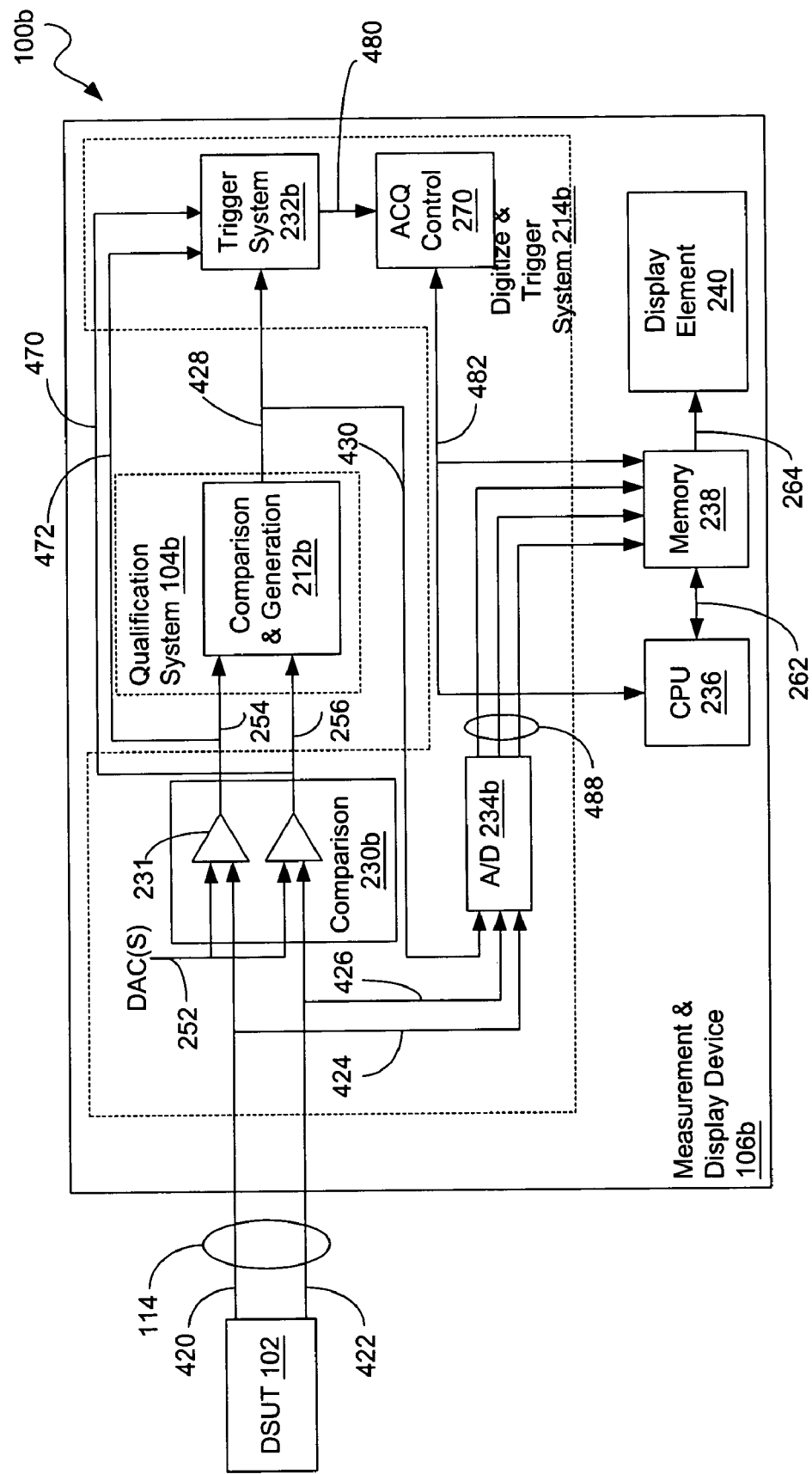
FIG. 4 is a block diagram that illustrates the qualification system embodiment of FIG. 1B and cooperating components.

FIG. 4 is a block diagram that illustrates the qualification system embodiment and cooperating components of the test system 100b illustrated in FIG. 1B. The test system 100b includes much of the same components and/or the corresponding functionality as described for the test system 100a shown in FIG. 2, including a digitize and trigger system 214b, the qualification system 104b, the CPU 236, memory 238, and the display element 240. The digitize and trigger system 214b includes the acquisition controller 270, a comparison element 230b, an A/D converter element 234b, and a trigger system 232b. The qualification system 104b includes a comparison and generation module 212b. Unlike the qualification system 104a of FIG. 2, the qualification system 104b is internal to the MTD device 106b. For clarity, connections for the other DSUT signals (such as applied to terminal 242 as shown in FIG. 2) and associated MTD device hardware are not shown.

DSUT signals from the DSUT 102 are provided over connection 114 to comparison element 230b. Connection 114 includes connections 420 and 422, although more or fewer connections can be used, and/or wireless communication can be used. DSUT signals are also passed to an A/D converter element 234b over connections 424 and 426. The comparison element 230b includes one or more comparators 231 that perform a comparison between a threshold voltage from a DAC (not shown) carried over connection 252 and the voltage levels of signals provided over connection 114. The resultant pulse signals provided at the output of the comparators 231 are provided over connections 254 and 256 and applied to the comparison and generation module 212b of the qualification system 104b. The pulse signals are also provided to the trigger system 232b over connections 470 and 472. Optionally, signals provided on connections 470 and 472 can be time-delayed, using devices such as delay-lines, to compensate for the inherent delays of signals on connections 254 and 256 when processed by the comparison and generation module 212b.

The comparison and generation module 212b operates in a manner similar to the operations described in the flow diagrams of FIGS. 3A–3B. Accordingly, the comparison and generation module 212b compares DSUT signals (or representations of the DSUT signals) provided over connections 254 and 256 with a qualification specification provided by the CPU 236, and responsively provides a qualification signal over connection 428. The qualification signal on connection 428 is provided to the trigger system 232b for use by the trigger system 232b, as well as provided to the A/D converter element 234b over connection 430 for digitization into a format for memory and then stored in memory 238 via connection 488. In other embodiments, the qualification signal 428 can be electrically compatible with memory 238. In this case, the qualification signal 428 does not have to be digitized by the A/D converter element 234b before being stored in memory 238. In addition, the qualification system 104b can include signal conditioning functionality similar to that described for the qualification system 104a of FIG. 2. For example, when analog characteristics of waveforms are to be qualified, DSUT signals can be provided from the DSUT 102 to an internal converter (not shown, but internal to the MTD device 106b and with similar functionality of the converter 210 in FIG. 2), bypassing the A/D converter element 234b, and the output of the converter can be provided to the comparison and generation module 212b in a manner similar to that shown in FIG. 2A. Acquisition, storage, and/or display occur according to similar mechanisms described for the test system 100a shown in FIG. 2.

Figure 5:
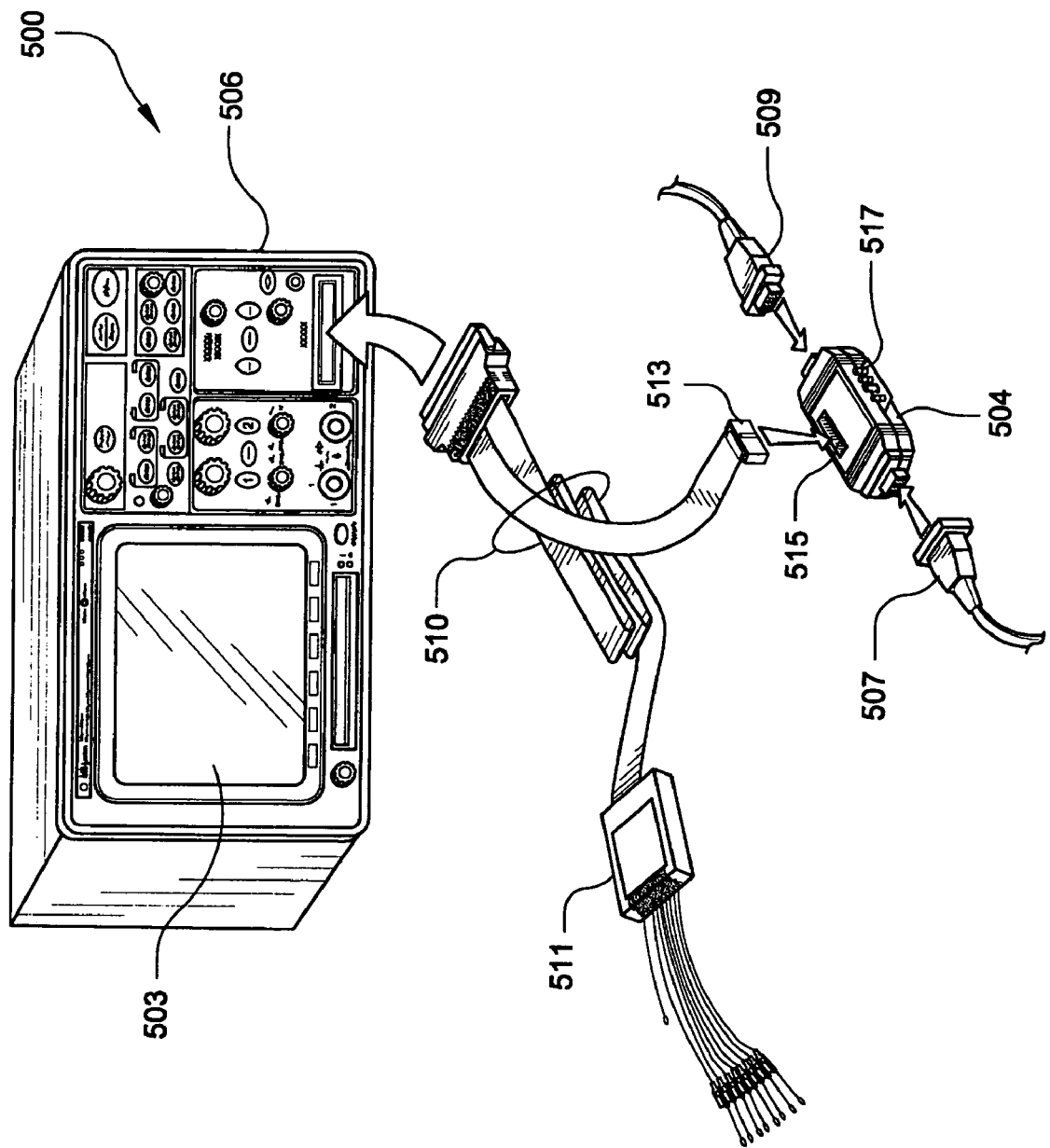
FIG. 5 is a schematic diagram of an example test system that uses the qualification system embodiment illustrated in FIG. 1A.

FIG. 5 is a schematic diagram of an example test system 500 that uses an external qualification system 504 similar to the test system 100a shown in FIG. 1A. As shown, an oscilloscope 506 represents an embodiment of a MTD device similar to the MTD device 106a shown in FIG. 2. The oscilloscope 506 is coupled to the qualification system 504 via a cable connector 510. The interface at the oscilloscope 506 to the cable connector 510 can be via a proprietary connector, among others. The oscilloscope 506 provides for the display of waveforms (events) occurring at a DSUT (not shown), among other functions. The display user interface (UI) 503 is used to show the various waveforms.

In one embodiment, the qualification system 504 is similar in structure and functionality to the qualification system 104a shown in FIG. 2. The qualification system 504 can be coupled to a DSUT via a 9-pin digital connectors 507 or 509 (depending on the connection configuration). The qualification system 504 includes a receptacle connector 515 for connecting to the cable connector 510 via a ribbon connector 513, such as a 16-pin ribbon connector. The qualification system 504 provides test points 517 for analog probing of the "raw" DSTU signals by the oscilloscope 506. Probe 511 is a general-purpose probe, for example as used at terminal 242 (FIG. 2).

Figure 6:
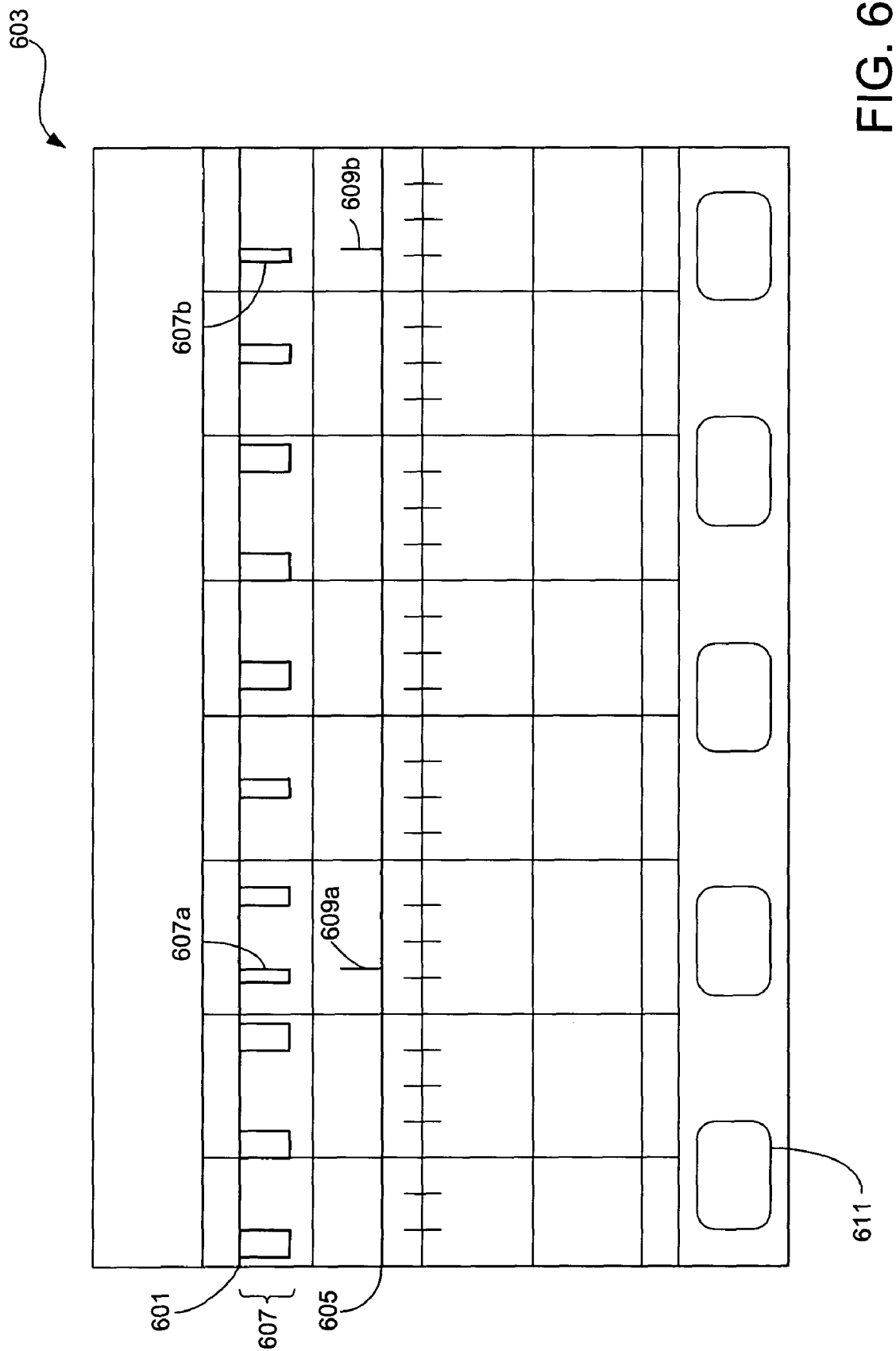
FIGS. 6–10 are schematic diagrams of various screen shots of the oscilloscope screen for the oscilloscope shown in FIG. 5, wherein the screen shots are used to illustrate the various functionality enabled by the qualification system.

FIGS. 6–10 are schematic diagrams of various oscilloscope screen shots that help illustrate the various functionality enabled by the qualification system 504 (FIG. 5). Discussion of FIGS. 6–10 is also made with continued reference to the test system 500 shown in FIG. 5. Shown in FIG. 6 is a display UI 603 that includes a DSUT signal waveform line 601 and a qualification signal line 605. The DSUT signal waveform line 601 can correspond to the output of a converter (not shown) of the qualification system 504, similar in structure and functionality to the converter 210 (FIG. 2), which provides "raw" or signal-conditioned DSUT signals. As shown, the waveform on the DSUT signal waveform line 601 includes a series of packets 607 having a high or low value corresponding to the activity on a bus or other location in the DSUT. The width of each packet indicates that different data is included within. The qualification signal line 605 indicates whether the acquired waveform (the event, in this example, packets 607 containing a certain data value) matches the user-defined qualification specification. In other words, the qualification system 504 generates a pulse 609a,b for every event that matches the qualification specification passed to it. Thus, as shown in the display 603, packets 607a and 607b match the qualification specification as reflected by the corresponding qualification signal pulses 609a and 609b. Internally, the oscilloscope 506 triggers on the rising edge of the pulses 609a,b on the qualification signal line 605, although other variations for triggering are possible. The buttons 611 include identifying text (not shown) that provide a user with information about the qualification and/or trigger specification and provide user-input options, such as changing the qualification specification as desired, among other options.

Figure 7:
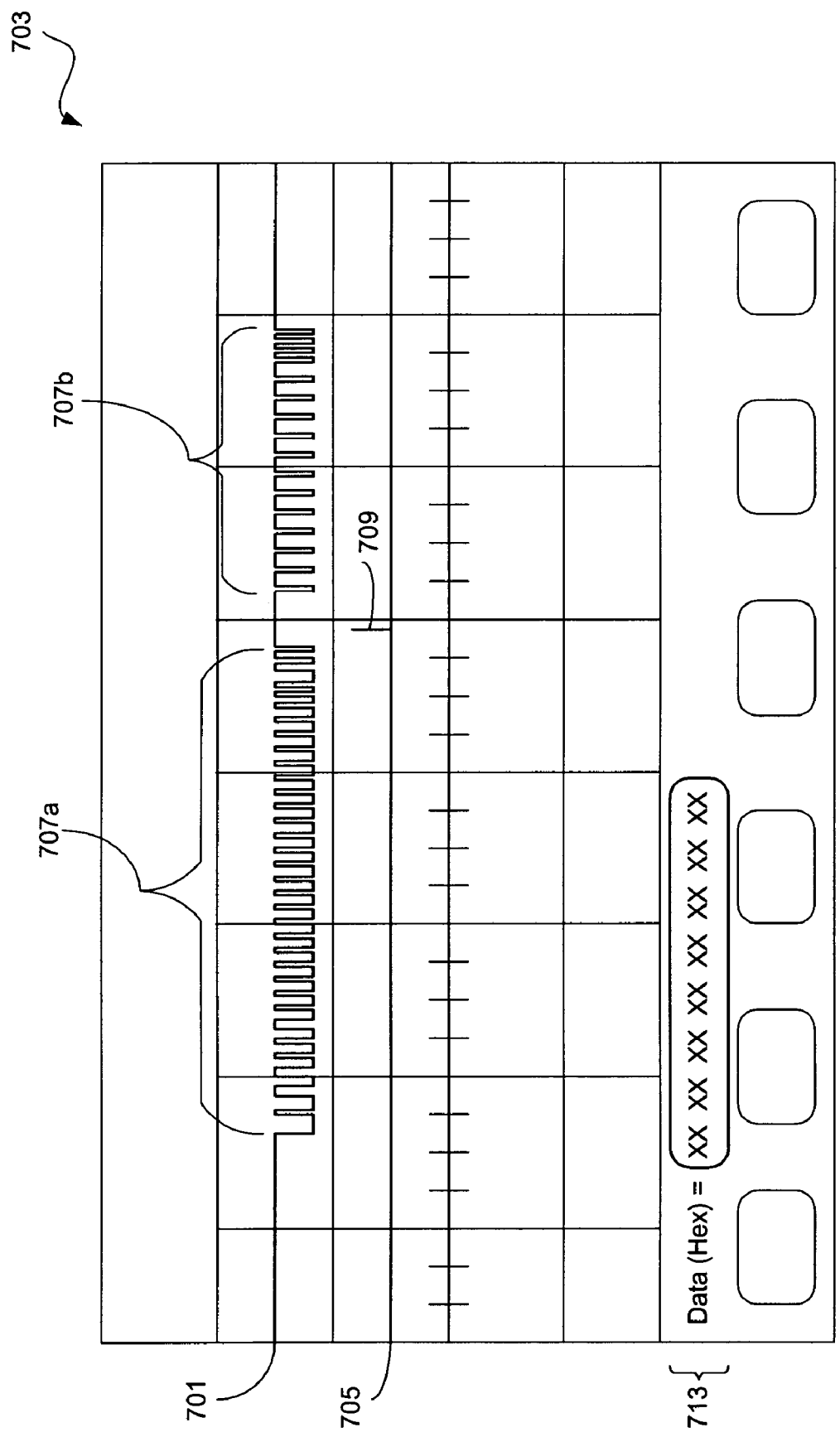

FIG. 7 is an example display UI 703 that provides a user a display of CAN packets 707a and 707b, as shown in the DSUT signal line 701. A qualification signal pulse 709 is generated in response to the CAN packet 707a matching the qualification specification, whereas the absence of a qualification signal pulse corresponding to the CAN packet 707b indicates that the CAN packet 707b does not meet the qualification specification. Configuration information 713 is provided at the bottom of the display UI 703, providing a hexadecimal representation of the salient qualification specification data that qualifies as a qualified event. In other words, the configuration information 713 includes at least part of the qualification specification that designers deem most useful to a user, and provides feedback to the user about what he or she specified. For the display of actual detected values, the oscilloscope 506 can use the communication channel to query the qualification system 504 about what it captured.

Figure 8:
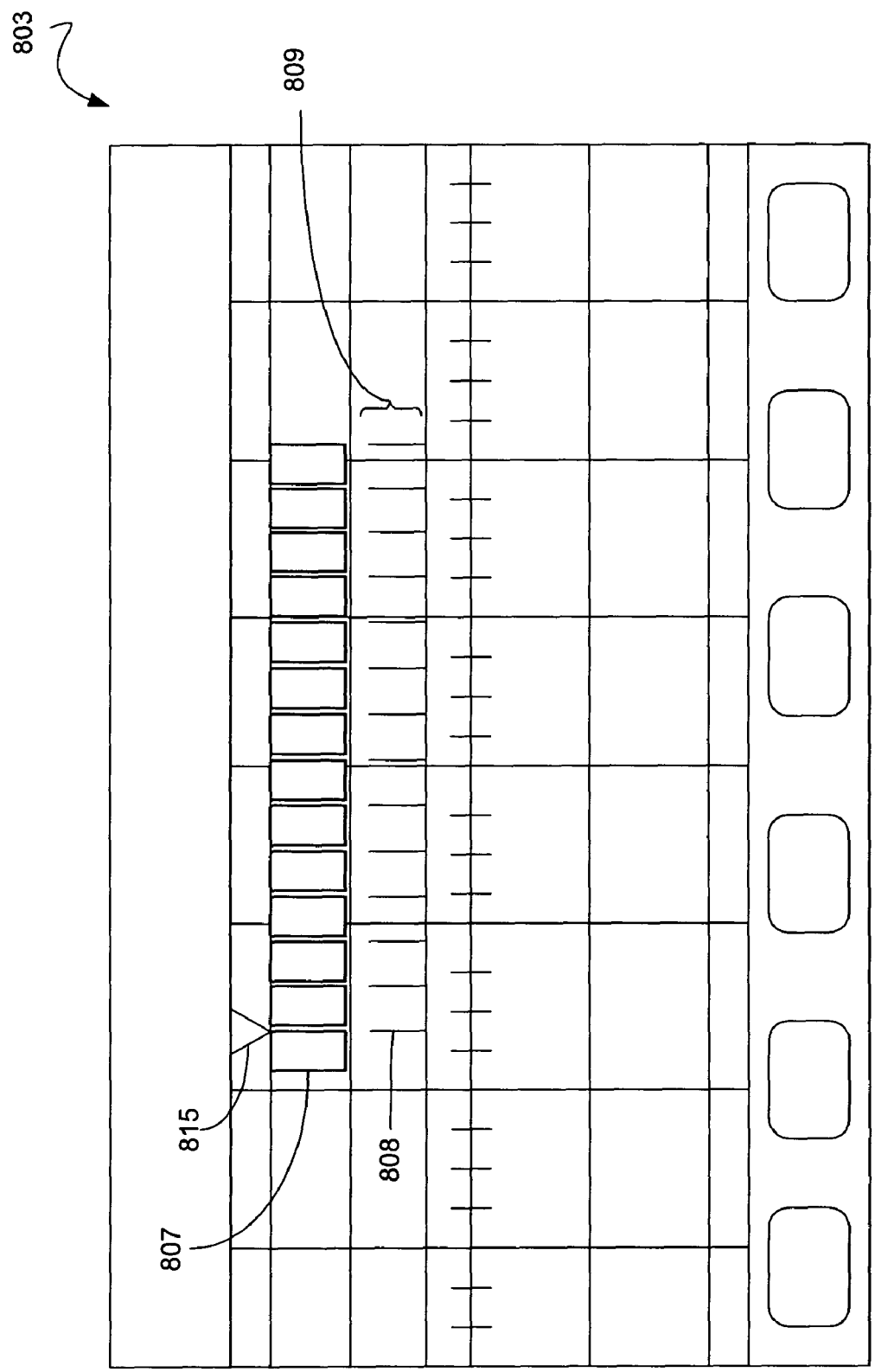

FIG. 8 is an example display UI 803 that illustrates how the qualification system 504 can provide an indication of qualified events that the oscilloscope 506 by itself does not adequately display. The triangle symbol 815 at the top of the display UI 803 represents the "time mark" signal generated by the trigger system. This indicates where in time the trigger event occurred. It also shows that the oscilloscope 506 triggered only on the first qualification pulse 808 of collective qualification signal pulses 809 of the acquired DSUT signal. The series of qualification signal pulses 809 (including first qualification pulse 808) represents that the qualification system 504 qualified other matching events (e.g., matching the qualification specification) that the oscilloscope 506 was unable to display on the single display UI 803. For example, the qualification system 504 is able to indicate that more than one error condition occurred on the bus during acquisition. Because the qualification signal is provided to the oscilloscope 506 and digitized, matching events are displayed, as opposed to only enabling a user to view the one guaranteed trigger event per display. In the case of one trigger event per display, a user has to manually scan the DSUT signals 807 via a post-acquisition search if he or she is interested in searching for other matching events in the captured time window. In addition, the qualified events (represented by pulses 809) occurring after the first qualified event 808 cannot be determined in conventional systems without the qualification system 504, even if multiple oscilloscopes are cascaded via the "trigger out" connection.

Figure 9A:
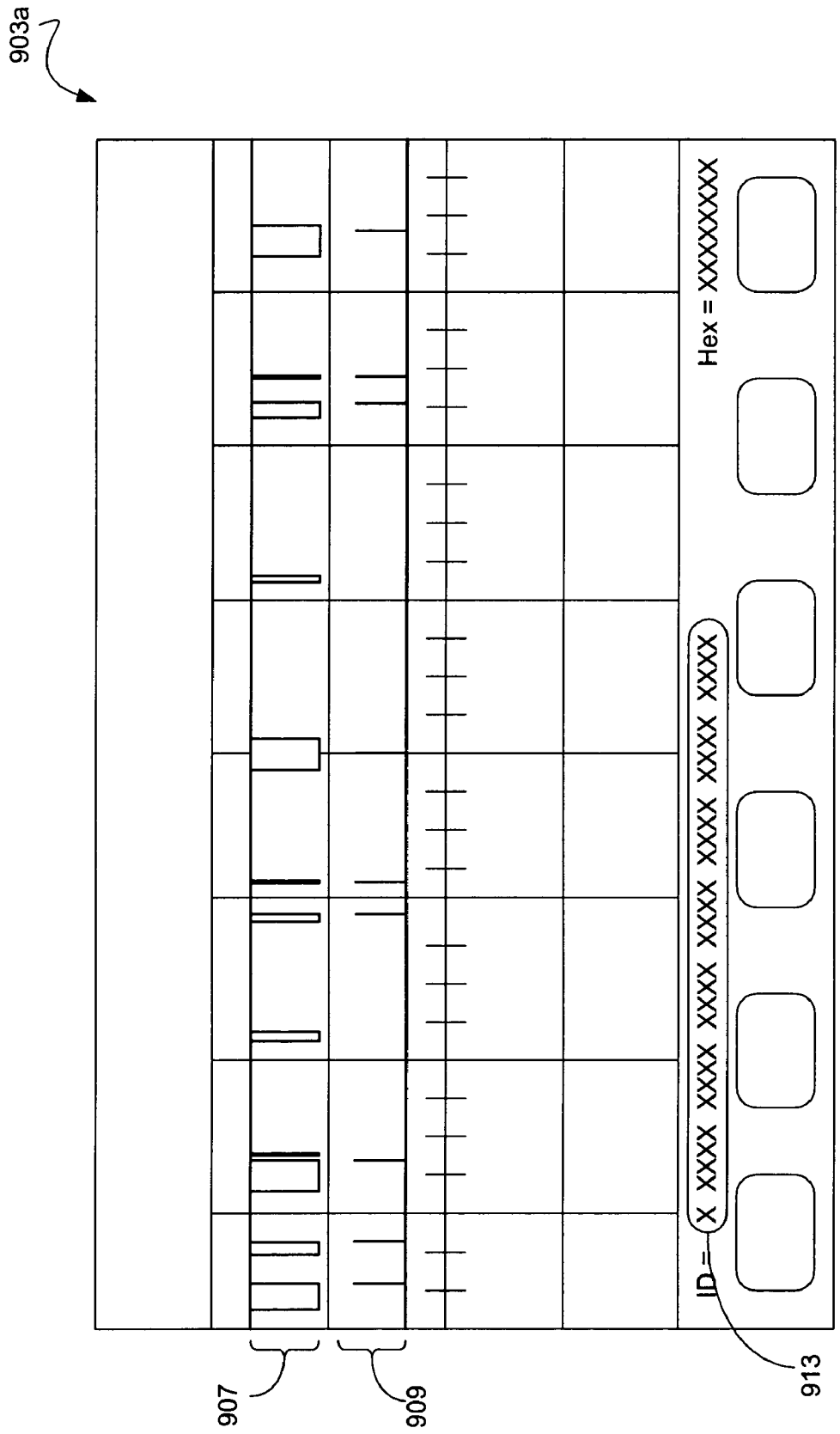
Figure 9B:
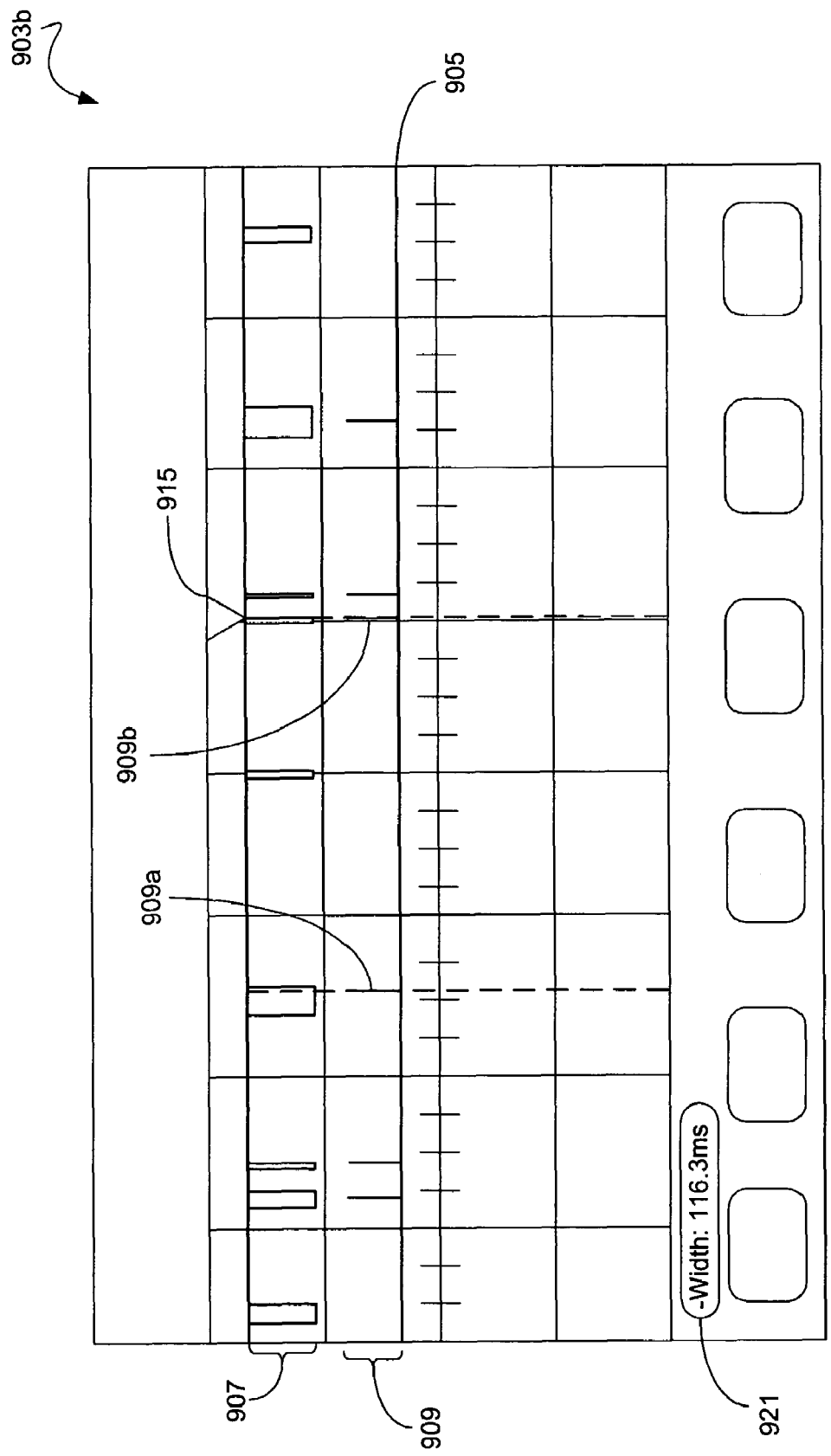

FIGS. 9A–9B provide display UIs that illustrate the combining of qualification signals enabled by the qualification system 504. Using the existing trigger modes of the oscilloscope 506, the qualification system 504 can be used to create more complex trigger specifications, which can provide an indication of more complex behavior to the user. For example, the pulse width mode can be used to look at the delay/latency between two matching CAN frames. Shown in FIG. 9A is a display UI 903a that shows a plurality of DSUT signal packets 907 that represent various sizes of CAN frames. Qualification signal pulses 909 are generated for DSUT signal packets 907 that meet the qualification specification. Configuration information 913 is similar to that described for configuration information 713 (FIG. 7).

FIG. 9B is a display UI 903b that illustrates further triggering capabilities for the oscilloscope 506 as enabled by the qualification system 504. The combination of the oscilloscope 506 and the qualification system 504 is configured to detect, for example, a delay of at least 100 msec between the DSUT signal packets 907 (extended ID frames). The qualification system 504 is still generating qualification pulses for all DSUT signal packets 907 that meet the qualification specification, as shown in FIG. 9A. However, instead of the triggering system of the oscilloscope 506 triggering on the rising edge of the qualification signal pulses 909, the trigger system is now in a pulse width trigger mode. In other words, the oscilloscope 506 is now triggering on the delay between qualification signals (qualified events) by comparing the width (time) of a negative pulse on the qualification signal line 905. By placing the oscilloscope 506 in the pulse width trigger mode, and using the qualification system 504, all or substantially all of the qualification signal pulses are displayed. The oscilloscope 506 triggers on qualification signal activity that meets the pulse width requirement. Thus, the oscilloscope 506 triggers when two pulses 909a and 909b are separated in time by a defined duration (here, 116.3 ms, as shown in the width calculation 921). Note the vertical, dotted lines used to measure the delay between the two qualification signal pulses 909a and 909b that meet the qualification specification, in addition to the triangle symbol (time mark) 915 demarcating when the oscilloscope's trigger specification was matched, causing the oscilloscope 506 to trigger.

Figure 10:
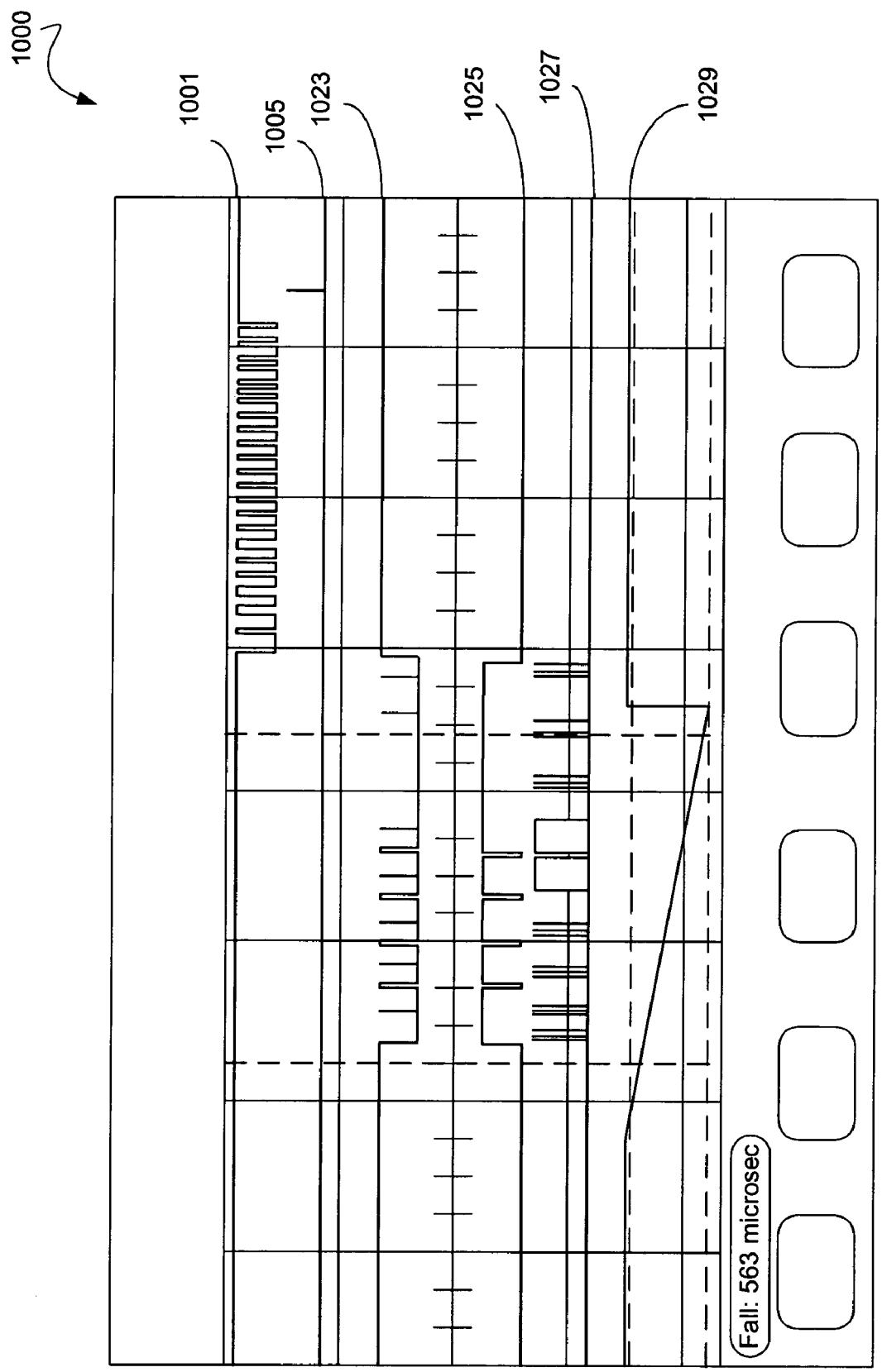

FIG. 10 is a display UI 1000 that illustrates that DSUT signals can be displayed along with other signals captured by the oscilloscope 506. In this case, the oscilloscope 506 has triggered on the activity associated with the broadcast of a sensor reading. Line 1001 represents the signals provided from a CAN bus. The displayed packet on line 1001 includes the digitized sensor information. Line 1005 represents the qualification signal. Lines 1023, 1025, and 1027 represent the chip-select, clock, and data line signals, respectively, of another internal serial bus used for the sensor. Line 1029 represents the analog signal to which measurement values are sought, the converted version which is shown on line 1001. The user may choose to trigger when a predetermined analog value is present on the A/D line (line 1001). The sensor hardware conveys this value through the serial bus, which is what the qualification system 504 can trigger on. The oscilloscope 506 then triggers on the qualification signal from the qualification system 504, displaying the activity that generated the qualification signal, and therefore, the trigger.

It should be emphasized that the above-described embodiments are merely possible examples of implementations. Many variations and modifications may be made to the above-described embodiment(s). All such modifications and variations are intended to be included herein within the scope of this disclosure and protected by the following claims.

Therefore, at least the following is claimed:

1. A qualification method for enabling a measurement, trigger, and/or display (MTD) device to synchronize the acquisition and display of qualified events occurring in a device under test, the method comprising:

receiving an event, wherein the event comprises a signal waveform;

receiving a qualification specification from the MTD device, wherein the qualification specification provides at least one criterion for determining whether an event is a qualified event;

comparing the event with the qualification specification;

determining whether the event is a qualified event based on the at least one criterion; and responsive to determining that the event is a qualified event, providing an indication to the MTD device of each qualified event.

2. The method of claim 1, wherein receiving an event comprises receiving at least one of digital signals and analog signals from a device under test.

3. The method of claim 1, wherein comparing the event comprises matching waveform characteristics included in the qualification specification with waveform characteristics of the event.

4. The method of claim 1, wherein the qualification specification comprises at least one of bit patterns, waveform periodicity, waveform amplitude, sampling values, parallel bit patterns, serial bit patterns, waveform modulation, and pulse duration.

5. The method of claim 1, wherein providing an indication comprises providing a qualification signal for the qualified event.

6. The method of claim 5, wherein the qualification signal comprises a pulse signal.

7. The method of claim 1, further comprising at least one of passing the event to the MTD device and providing a representation of the event to the MTD device, wherein the MTD device displays at least one of the event and the representation of the event.

8. A qualification system coupled to a measurement, trigger, and/or display (MTD) device, the qualification system enabling the MTD device to synchronize the acquisition and display of qualified events occurring in a device under test, the qualification system comprising:

compare logic configured to receive an event, wherein the event comprises a signal waveform, receive a qualification specification from the MTD device, compare the event with a qualification specification, wherein the qualification specification provides criteria for determining whether an event is a qualified event, and determine whether the event is a qualified event based on the criteria; and generate logic configured to, responsive to determining that the event is a qualified event, provide an indication to the MTD device of each qualified event.

9. The system of claim 8, further comprising a converter for receiving the event.

10. The system of claim 9, wherein the converter provides at least one of amplification, demodulation, and digitization of the event.

11. The system of claim 9, wherein the converter provides at least one of the event and a representation of the event to the MTD device.

12. The system of claim 9, wherein the converter provides at least one of the event and a representation of the event to the compare logic.

13. The system of claim 8, wherein the compare logic is configured to match waveform characteristics included in the qualification specification with waveform characteristics of the event.

14. The system of claim 8, wherein the generate logic is configured to provide an indication in the form of at least one of a qualification signal for the qualified event, a plurality of qualification signals for a plurality of qualified events, and a qualification signal for a plurality of events.

15. The system of claim 14, wherein the qualification signal is a pulse signal corresponding to the each qualified event.

16. The system of claim 8, further comprising at least one of a bypass connection for passing an event received from a device under test to the MTD device.

17. The system of claim 8, wherein the compare logic and the generate logic are configured in a comparison and generation module, the comparison and generation module configured as at least one of a microcontroller, discrete logic circuits having logic gates for implementing logic functions upon data signals, an application specific integrated circuit (ASIC) having appropriate combinational logic gates, a programmable gate array(s) (PGA), a field programmable gate array (FPGA), a complex programmable logic device (CPLD), and analog circuitry.

18. The system of claim 8, wherein the compare logic and the generate logic are configured as software.

19. The system of claim 8, wherein the compare logic and the generate logic are configured in a computer readable medium.

20. The system of claim 8, wherein the compare logic is further configured to compare an event with a plurality of qualification specifications.

21. A test system, comprising:
a qualification system comprising:
compare logic configured to receive an event, wherein the event comprises a signal waveform, receive a qualification specification from a measurement. trigger, and/or display (MTD) device, compare the event with a qualification specification, wherein the qualification specification provides criteria for determining whether an event is a qualified event, and determine whether the event is a qualified event based on the criteria;
generate logic configured to, responsive to determining that the event is a qualified event, provide a first indication for each qualified event; and
a measurement, trigger, and/or display (MTD) device configured to receive the first indication and, responsive to receiving the first indication, display the first indication of the each qualified event.

22. The system of claim 21, wherein the MTD device is further configured to display the qualified event.

23. The system of claim 21, wherein the MTD device is further configured to combine the first indication with a second indication of another qualified event.

24. The system of claim 21, wherein the MTD device is further configured to combine the first indication with a plurality of indications corresponding to a plurality of qualified events.

25. The system of claim 21, wherein the qualification system is located at least one of internal to the MTD device and external to the MTD device.

26. The system of claim 21, wherein the MTD device is at least one of an oscilloscope and a logic analyzer.

27. The system of claim 21, wherein the qualification system provides an indication for each qualified event in a controller area network signal.

28. The system of claim 21, wherein the MTD device uses the first indication as a basis for determining whether to trigger on the corresponding qualified event.

29. The system of claim 21, further including additional qualification systems coupled to the MTD device, wherein the additional qualification systems are at least one of externally located to the MTD device and located within the MTD device.

30. The system of claim 21, wherein the qualification system and the each of the additional qualification systems are configured in a parallel arrangement with respect to the MTD device.

31. The system of claim 21, wherein the qualification system and the each of the additional qualification systems are configured in a serial arrangement with respect to the MTD device.

* * * * *